US011454774B2

(12) United States Patent
Hsiao et al.

(10) Patent No.: US 11,454,774 B2
(45) Date of Patent: Sep. 27, 2022

(54) CONNECTOR WITH HEAT SINK

(71) Applicant: BIZLINK INTERNATIONAL CORPORATION, New Taipei (TW)

(72) Inventors: Hsin-Tuan Hsiao, New Taipei (TW); Jui-Hung Chien, New Taipei (TW)

(73) Assignee: BIZLINK INTERNATIONAL CORPORATION, New Taipei (TW)

( * ) Notice: Subject to any disclaimer, the term of this patent is extended or adjusted under 35 U.S.C. 154(b) by 0 days.

(21) Appl. No.: 17/099,882

(22) Filed: Nov. 17, 2020

(65) Prior Publication Data

US 2021/0247577 A1 Aug. 12, 2021

(30) Foreign Application Priority Data

Feb. 7, 2020 (TW) .................................. 109201352

(51) Int. Cl.
*H04B 10/00* (2013.01)
*G02B 6/42* (2006.01)
*H05K 7/20* (2006.01)
*H01R 13/66* (2006.01)

(52) U.S. Cl.
CPC ........... *G02B 6/4269* (2013.01); *G02B 6/428* (2013.01); *H01R 13/66* (2013.01); *H05K 7/2039* (2013.01)

(58) Field of Classification Search
CPC combination set(s) only.
See application file for complete search history.

(56) References Cited

U.S. PATENT DOCUMENTS

| 7,941,053 | B2 * | 5/2011 | Dallesasse | H04B 10/40 |
| | | | | 398/139 |
| 9,389,368 | B1 * | 7/2016 | Sharf | G02B 6/4269 |
| 9,620,907 | B1 * | 4/2017 | Henry | H01R 13/6582 |
| 9,668,379 | B1 * | 5/2017 | Bucher | H01R 13/514 |
| 9,671,580 | B1 * | 6/2017 | Nagarajan | H04B 1/3833 |
| 9,935,403 | B1 * | 4/2018 | Briant | H05K 9/0018 |
| 10,073,230 | B2 * | 9/2018 | Wilcox | G02B 6/4278 |
| 10,104,760 | B1 * | 10/2018 | Briant | G02B 6/4284 |
| 10,128,627 | B1 * | 11/2018 | Kazav | G02B 6/4269 |
| 10,782,492 | B2 * | 9/2020 | Meunier | H05K 7/20445 |
| 2005/0148223 | A1 * | 7/2005 | Shirk | G02B 6/4246 |
| | | | | 439/160 |
| 2005/0230795 | A1 * | 10/2005 | Furuyama | G02B 6/428 |
| | | | | 257/678 |
| 2007/0183128 | A1 * | 8/2007 | Pirillis | H05K 7/20418 |
| | | | | 361/715 |

(Continued)

*Primary Examiner* — Agustin Bello
(74) *Attorney, Agent, or Firm* — Rabin & Berdo, P.C.

(57) ABSTRACT

A connector has a case, a circuit board, a thermal diffusing unit, and a first heat sink. The circuit board is mounted in the case and has a heating source. The thermal diffusing unit abuts the inner surface of the case and the heating source of the circuit board. A heat transfer coefficient of the thermal diffusing unit is larger than a heat transfer coefficient of the case. The first heat sink abuts the thermal diffusing unit and is exposed from the case. A heat transfer coefficient of the first heat sink is larger than the heat transfer coefficient of the case. By the first heat sink abutting the thermal diffusing unit and exposed from the case, and the heat transfer coefficients of both the thermal diffusing unit and the first heat sink being larger than that of the case, the heat dissipation efficiency is improved.

20 Claims, 9 Drawing Sheets

(56) References Cited

U.S. PATENT DOCUMENTS

| | | | | |
|---|---|---|---|---|
| 2011/0051373 | A1* | 3/2011 | McColloch | G02B 6/4246 361/709 |
| 2012/0220152 | A1* | 8/2012 | Wu | H01R 13/6581 439/350 |
| 2013/0077254 | A1* | 3/2013 | Nguyen | G02B 6/4269 361/715 |
| 2013/0210269 | A1* | 8/2013 | Neer | H05K 7/20145 439/487 |
| 2014/0120779 | A1* | 5/2014 | Lloyd | H01R 12/53 439/660 |
| 2014/0153192 | A1* | 6/2014 | Neer | H05K 9/0058 361/704 |
| 2014/0311725 | A1* | 10/2014 | Balasubramanian | F28F 13/08 165/168 |
| 2014/0361672 | A1* | 12/2014 | Whang | G06F 1/188 312/223.2 |
| 2015/0296638 | A1* | 10/2015 | Wu | H05K 7/20409 174/548 |
| 2015/0362682 | A1* | 12/2015 | Waldron | G02B 6/3825 385/84 |
| 2016/0149324 | A1* | 5/2016 | Regnier | H01R 43/205 439/76.1 |
| 2016/0211623 | A1* | 7/2016 | Sharf | G02B 6/4269 |
| 2016/0211625 | A1* | 7/2016 | Sharf | G02B 6/4284 |
| 2017/0054234 | A1* | 2/2017 | Kachlic | H01R 13/6594 |
| 2017/0133777 | A1* | 5/2017 | Little | H01R 13/6275 |
| 2017/0285282 | A1* | 10/2017 | Regnier | G02B 6/3897 |
| 2018/0009072 | A1* | 1/2018 | Kittel | H01L 21/4803 |
| 2018/0034211 | A1* | 2/2018 | Little | H01R 13/642 |
| 2018/0049348 | A1* | 2/2018 | Bucher | H01R 13/6581 |
| 2018/0116063 | A1* | 4/2018 | Tracy | H05K 7/2039 |
| 2018/0124953 | A1* | 5/2018 | Engelhardt | H05K 7/20554 |
| 2018/0206353 | A1* | 7/2018 | Briant | H05K 9/002 |
| 2018/0212385 | A1* | 7/2018 | Little | H01R 13/504 |
| 2018/0306989 | A1* | 10/2018 | Khazen | G02B 6/4269 |
| 2018/0338387 | A1* | 11/2018 | Park | G02B 6/4269 |
| 2018/0368283 | A1* | 12/2018 | Little | H05K 7/20336 |
| 2019/0013617 | A1* | 1/2019 | Ayzenberg | H05K 9/0058 |
| 2019/0044299 | A1* | 2/2019 | Kazav | H01R 13/518 |
| 2019/0116692 | A1* | 4/2019 | Little | H05K 7/20418 |
| 2019/0157810 | A1* | 5/2019 | Little | H01R 12/72 |
| 2019/0181593 | A1* | 6/2019 | Little | H01R 13/6587 |
| 2019/0230817 | A1* | 7/2019 | Han | G02B 6/4269 |
| 2019/0278037 | A1* | 9/2019 | Leigh | E05C 3/14 |
| 2019/0296493 | A1* | 9/2019 | Liu | H01R 13/7172 |
| 2019/0306985 | A1* | 10/2019 | Ferguson | H05K 1/181 |
| 2020/0049912 | A1* | 2/2020 | Lu | H01R 13/6581 |
| 2020/0113077 | A1* | 4/2020 | Tittenhofer | H05K 5/0256 |
| 2020/0142142 | A1* | 5/2020 | Luo | G02B 6/4278 |
| 2020/0150366 | A1* | 5/2020 | Tittenhofer | G02B 6/4256 |
| 2020/0232715 | A1* | 7/2020 | Hanafusa | H05K 7/20 |
| 2020/0233162 | A1* | 7/2020 | Yu | G02B 6/4284 |
| 2020/0309458 | A1* | 10/2020 | Chen | H01L 23/3675 |
| 2021/0072472 | A1* | 3/2021 | Curtis | G02B 6/4278 |
| 2021/0072473 | A1* | 3/2021 | Wall, Jr. | H05K 1/0274 |
| 2021/0103108 | A1* | 4/2021 | Wall, Jr. | H04B 10/40 |
| 2021/0105025 | A1* | 4/2021 | Wall, Jr. | G02B 6/4269 |
| 2021/0141175 | A1* | 5/2021 | Wang | G02B 6/423 |
| 2021/0247577 | A1* | 8/2021 | Hsiao | H05K 7/2039 |

* cited by examiner

CONNECTOR WITH HEAT SINK

BACKGROUND OF THE INVENTION

1. Field of the Invention

The present invention relates to an electronic device with a cooling module, especially to an electronic connector with a heat sink.

2. Description of the Prior Arts

Due to the fast development of technologies such as 5G, AI, edge computing, TOT, etc., high-speed transmission for data is critical, and such transmission relies on specialized cables such as AOC (Active Optical Cable) or AEC (Active Ethernet Cable). However, during the transmission via the abovementioned specialized cables, the optical module or the IC generates high heat, which impacts the transmission speed. Therefore, the heat must be dissipated to ensure the performance.

A conventional method for cooling the optical module or the IC is applying a thermal paste or a thermal conductive sheet to the optical module or the IC, and making the thermal paste or the thermal conductive sheet contact a metal case to allow the optical module or the IC to transmit heat to the case to be cooled down.

Nevertheless, since the case must withstand external forces, the case must be made of a material having sufficient rigidity, which will lead to insufficient thermal conductivity of the material. Therefore, when the optical module or the IC transmits heat to the case, the heat can only be transmitted to an area of the cause, i.e., where the thermal paste or the thermal conductive sheet contacts the case, but cannot be transmitted to other areas of the case through insufficient thermal conductivity of the case's own material. Eventually, due to the small heat transmission area, the heat dissipation efficiency is low.

To sum up, how to meet the heat dissipation requirements for high-speed transmission under standard specifications has become a major issue in the field of transmission cable technology.

To overcome the shortcomings, the present invention provides a connector with a heat sink to mitigate or obviate the aforementioned problems.

SUMMARY OF THE INVENTION

The main objective of the present invention is to provide a connector with a heat sink that can achieve a larger heat conducting area through a thermal diffusing unit, so the heat dissipation efficiency is higher. Besides, the heating source can further dissipate heat through the first cooling fin exposed out of the case, so the heat dissipation performance can be further improved.

The connector is adapted to be mounted in an electronic device along an inserting direction. The connector has a case, a circuit board, a thermal diffusing unit, and a first heat sink. The case has an inner surface. The circuit board is mounted in the case and has a heating source. The thermal diffusing unit abuts the inner surface of the case and the heating source of the circuit board. A heat transfer coefficient of the thermal diffusing unit is larger than a heat transfer coefficient of the case. The first heat sink abuts the thermal diffusing unit and is exposed from the case. A heat transfer coefficient of the first heat sink is larger than the heat transfer coefficient of the case. The first heat sink has a base board, multiple first cooling fins, and multiple first cooling wind passages. The base board has a first surface and a second surface. The first surface abuts the thermal diffusing unit. The second surface is opposite to the first surface. The first cooling fins are formed on the second surface of the base board and extend toward a direction away from the base board. The first cooling fins are spaced apart from each other and are parallel to each other. The first cooling wind passages are respectively formed between the first cooling fins. Each of the first cooling wind passages is formed between two adjacent ones of the first cooling fins.

With the heat transfer coefficient of the material of the thermal diffusing unit being larger than that of the case, the thermal diffusing unit abutting both the inner surface of the case and the heating source of the circuit board, and the area of the thermal diffusing unit abutting the inner surface being bigger than the area of the thermal diffusing unit abutting the heating source, the thermal diffusing unit is allowed to transmit heat from a small area to a big area, thereby enlarging the heat conducting area of the heating source and improving the heat dissipation efficiency.

In addition, with the first heat sink abutting the thermal diffusing unit and being exposed from the case, and the heat transfer coefficient of the material of the first heat sink being larger than the case, the heat generated by the heating source can be transmitted sequentially through the thermal diffusing unit and the first heat sink to the air outside the case, thereby further improving the heat dissipation efficiency.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
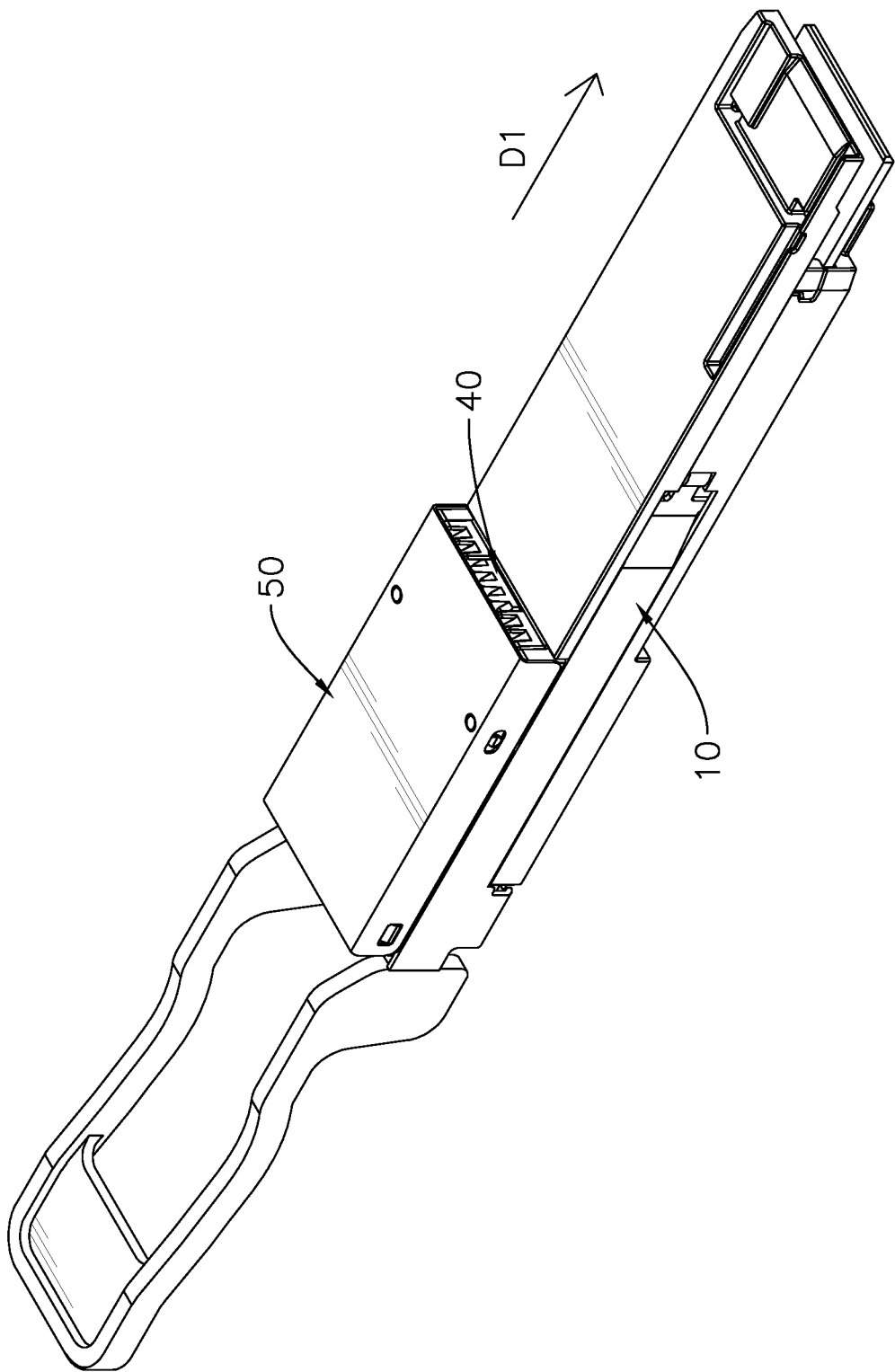
FIG. 1 is a perspective view of a connector in accordance with the present invention.
Figure 2:
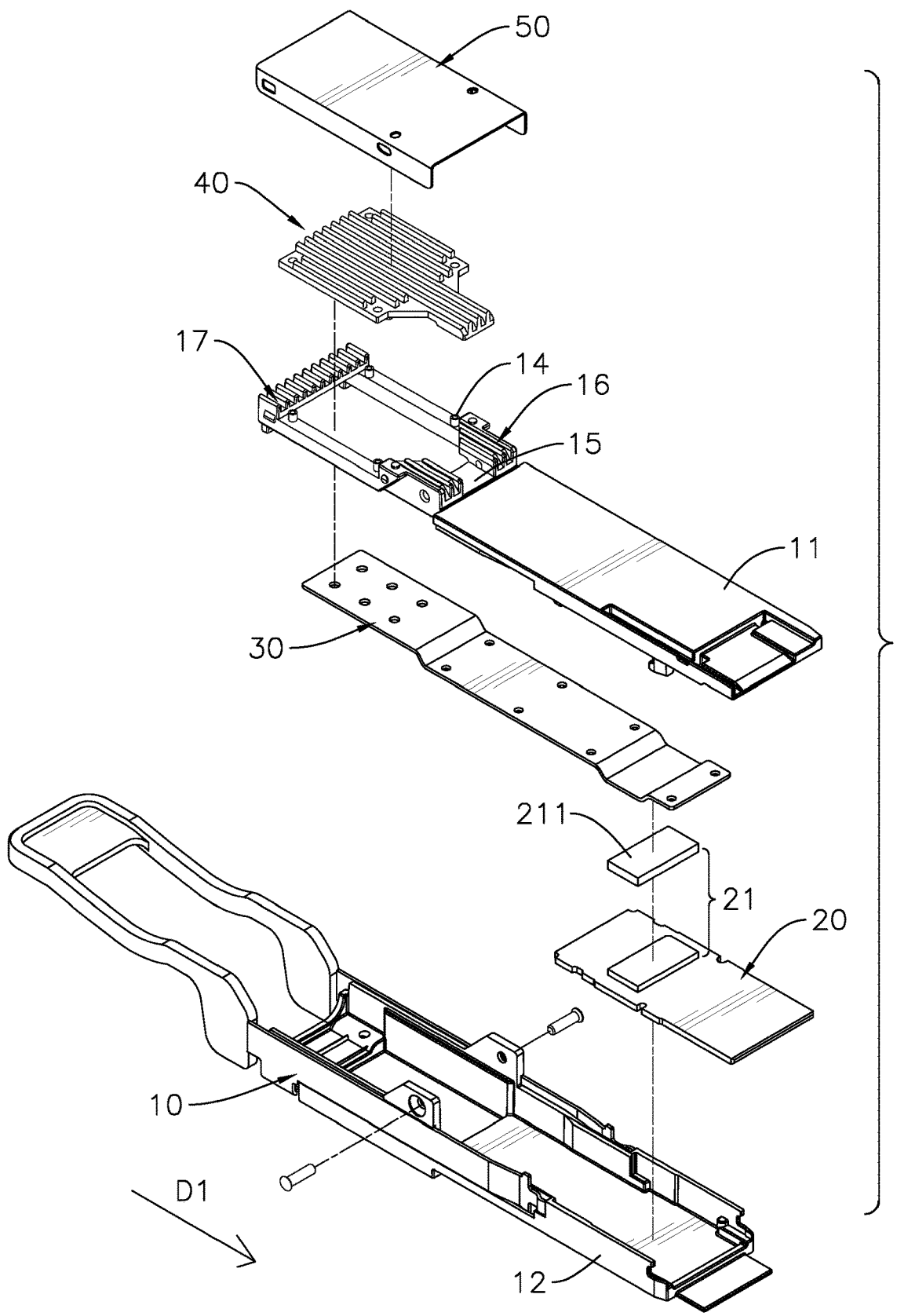
FIG. 2 is an exploded view of the connector in FIG. 1.
Figure 3:
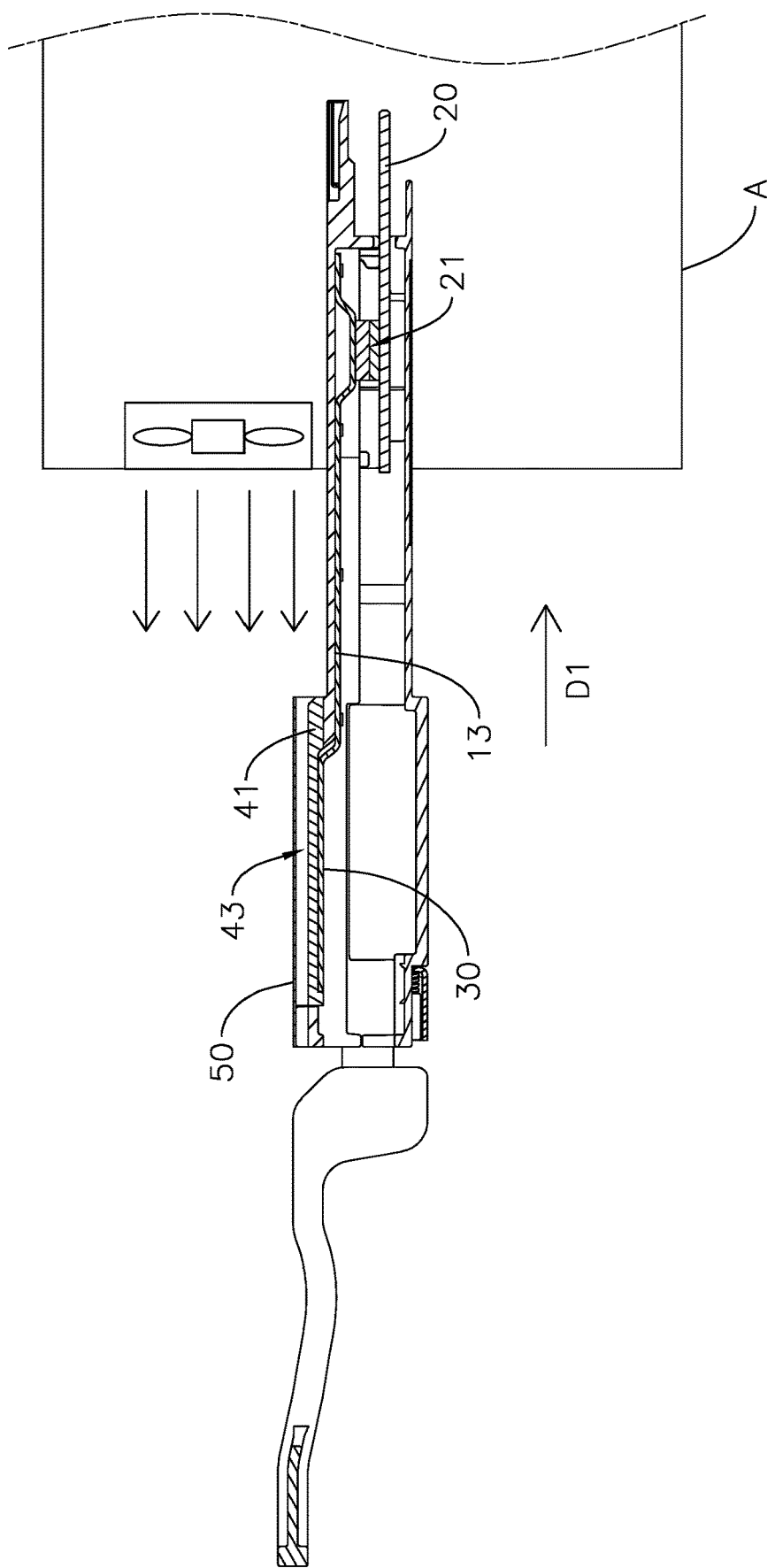
FIG. 3 is a side view in cross-section of the connector in FIG. 1.

With reference to FIGS. 1, 2, and 3, a connector in accordance with the present invention is adapted to be mounted in an electronic device A along an inserting direction D1. The connector comprises a case 10, a circuit board 20, a thermal diffusing unit 30, and a first heat sink 40.

The case 10 can be formed by assembling a first shell 11 and a second shell 12. The case 10 has an inner surface 13.

The circuit board 20 is mounted in the case 10. In this embodiment, the inner surface 13 is formed on the first shell 11, and the circuit board 20 is mounted on the second shell 12. The circuit board 20 has a heating source 21. Specifically, the heating source 21 can be any electric unit such as an optical module or an IC, and the heating source 21 can comprise a thermal conductive sheet 211 or a thermal paste.

The thermal diffusing unit 30 abuts the inner surface 13 of the case 10 and the heating source 21 of the circuit board 20. Specifically, in an embodiment wherein the heating source 21 has a thermal conductive sheet 211 or a thermal paste, the thermal diffusing unit 30 abuts the thermal conductive sheet 211 or the thermal paste of the heating source 21, but in an embodiment wherein the heating source 21 does not have a thermal conductive sheet 211 or a thermal paste, the thermal diffusing unit 30 directly abuts the optical module or the IC.

An area of the thermal diffusing unit 30 abutting the inner surface 13 is, but not limited to, bigger than an area of the thermal diffusing unit 30 abutting the heating source 21. A heat transfer coefficient of the thermal diffusing unit 30 is larger than a heat transfer coefficient of the case 10. That is, the heat transfer coefficient of a material of the thermal diffusing unit 30 makes the heat generated by the heating source 21 transmitted quickly and evenly to the thermal diffusing unit 30, and to the whole surface of the thermal diffusing unit 30. Therefore, further with the area of the thermal diffusing unit 30 abutting the inner surface 13 being bigger than the area of the thermal diffusing unit 30 abutting the heating source 21, the heat conducting area can be enlarged.

Figure 4:
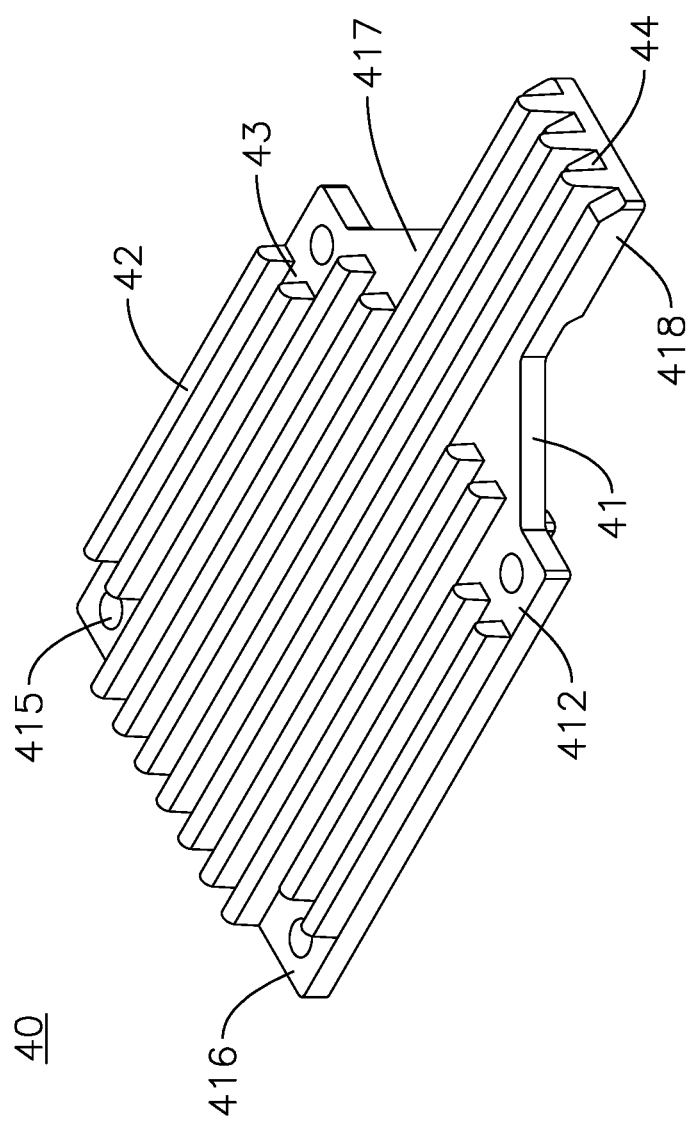
FIG. 4 is a perspective view of the connector in FIG. 1, showing the first heat sink.
Figure 6:
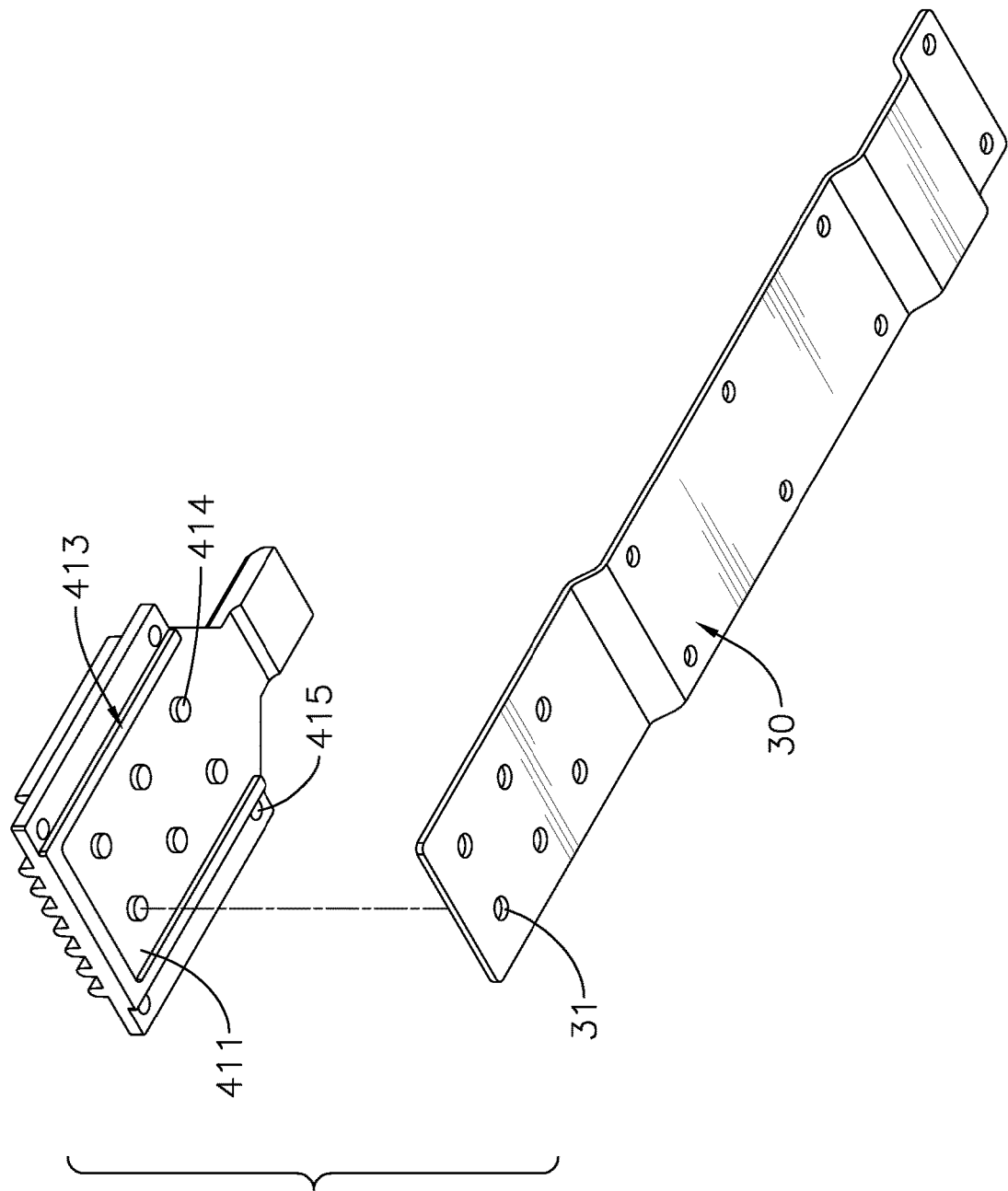
FIG. 6 is an exploded view of the connector in FIG. 1, showing the first heat sink and the thermal diffusing unit.
Figure 7:
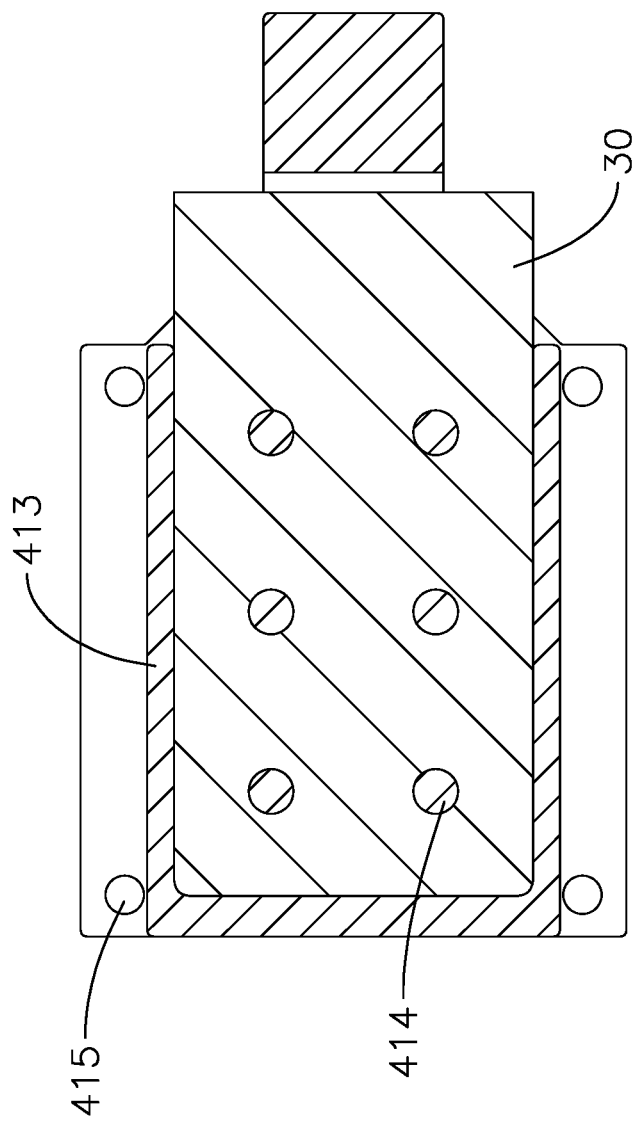
FIG. 7 is a bottom view in cross-section of the connector in FIG. 1, showing the first heat sink and the thermal diffusing unit.
Figure 8:
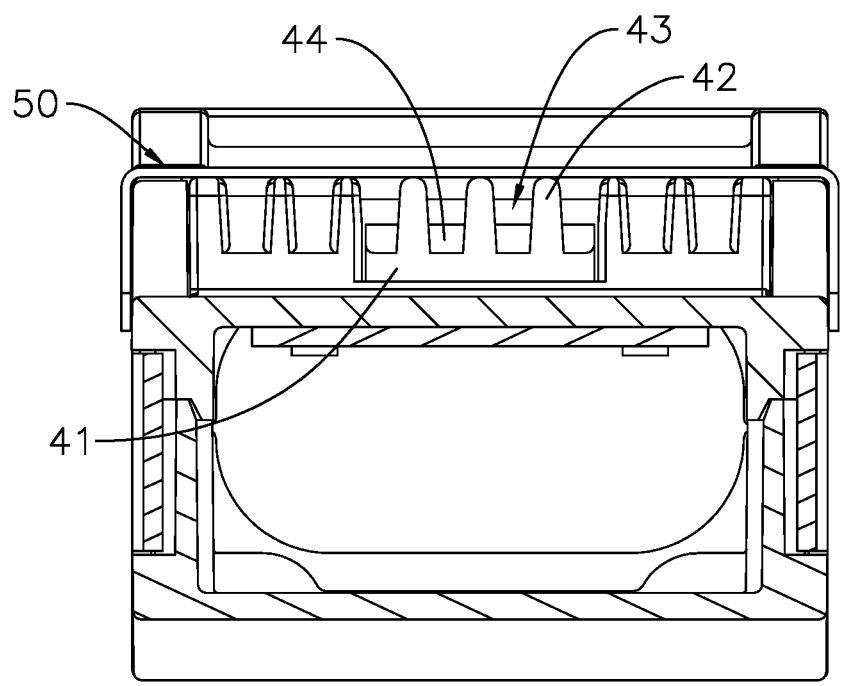
FIG. 8 is a front view in cross-section of the connector in FIG. 1.
Figure 9:
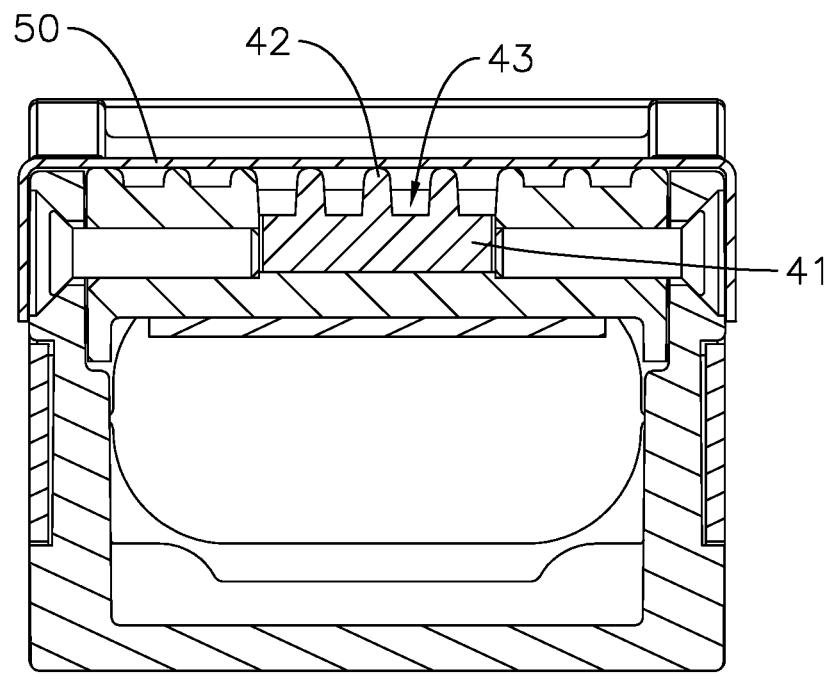
FIG. 9 is another front view in cross-section of the connector in FIG. 1.

With further reference to FIGS. 2, 4, and 6, the first heat sink 40 abuts the thermal diffusing unit 30 and is exposed from the case 10. In this embodiment, an area of the thermal diffusing unit 30 abutting the first heat sink 40 is, but not limited to, bigger than an area of the thermal diffusing unit 30 abutting the heating source 21. A heat transfer coefficient of the first heat sink 40 is larger than the heat transfer coefficient of the case 10, that is, the heat transfer coefficient of a material of the first heat sink 40 makes the heat generated by the heating source 21 quickly transmitted to the whole first heat sink 40.

The first heat sink 40 has a base board 41, multiple first cooling fins 42, and multiple first cooling wind passages 43. The base board 41 has a first surface 411 and a second surface 412 being opposite to each other. The first surface 411 abuts the thermal diffusing unit 30. The first cooling fins 42 are formed on the second surface 412 of the base board 41 and extends toward a direction away from the base board 41. The first cooling fins 42 are spaced apart from each other and are parallel to each other. The first cooling wind passages 43 are respectively formed between the first cooling fins 42. Each of the first cooling wind passages 43 is formed between two adjacent ones of the first cooling fins 42. Specifically, in this embodiment, each of the first cooling wind passages 43 extends straightly, but in other embodiments each of the first cooling wind passages 43 can also be curved.

Besides, in this embodiment, each of the first cooling wind passages 43 is parallel to the inserting direction D1 so that a fan inside the electronic device A can cool down the first heat sink 40 more effectively. But in other embodiments, each of the first cooling wind passages 43 can also be inclined to the inserting direction D1, as long as an opening of each of the first cooling wind passages 43 faces toward the inserting direction D1.

With further reference to FIGS. 2 and 5 to 7, in this embodiment, the base board 41 of the first heat sink 40 further has an assembling surrounding wall 413, multiple assembling pins 414, and multiple fixing holes 415. The thermal diffusing unit 30 further has multiple assembling holes 31. The case 10 further has multiple fixing pillars 14. The assembling surrounding wall 413 of the base board 41 of the first heat sink 40 is formed on the first surface 411 of the base board 41, and surrounds the edge of the thermal diffusing unit 30. The assembling pins 414 of the base board 41 of the first heat sink 40 are formed on the first surface 411 of the base board 41, and are respectively mounted in the assembling holes 31 of the thermal diffusing unit 30. The fixing pillars 14 of the case 10 are respectively mounted in the fixing holes 415 of the base board 41 of the first heat sink 40. By this, the first heat sink 40, the case 10, and the thermal diffusing unit 30 can be assembled firmly without other components. But the assembling structure between the first heat sink 40, the case 10, and the thermal diffusing unit 30 is not limited to the abovementioned, as the first heat sink 40, the case 10, and the thermal diffusing unit 30 can also be bonded or welded together.

With further reference to FIGS. 2, 4, 8, and 9, in this embodiment, the connector further has a heat sink cover 50, and the first heat sink 40 further has multiple windward slopes 44. The heat sink cover 50 is mounted on the case 10 and covers the first heat sink 40. The first cooling wind passages 43 are formed between the heat sink cover 50 and the base board 41. The windward slopes 44 are formed on a front side, which is in the front in the inserting direction D1, of the base board 41. The windward slopes are respectively located between the first cooling fins 42. Each of the windward slopes 44 is located between two adjacent ones of the first cooling fins 42 and facing toward the inserting direction D1. Specifically, each of the windward slopes 44 has a first edge and a second edge being opposite to each other. The second edge is connected to the second surface 412 of the base board 41. In the inserting direction D1, the first edge is located in front of the second edge. In other words, a normal of each of the windward slopes 44 extends toward the inserting direction D1 and is inclined to the heat sink cover 50. As a result, a cross-sectional area of an opening, which faces the inserting direction D1, of each of the first cooling wind passages 43 is bigger than a cross-sectional area of each of the first cooling wind passages 43, so the windward slopes 44 cooperate with the heat sink cover 50 to increase the wind speed, thereby improving the heat dissipation efficiency.

But in another embodiment, the connector can also be implemented without the heat sink cover 50, without the windward slopes 44, or without both the heat sink cover 50 and the windward slopes 44. Besides, in this embodiment, an edge, which is away from the base board 41, of each of the first cooling fins 42 abuts, but not limited to, the heat sink cover 50 such that the first cooling wind passages 43 are independent from each other.

Figure 5:
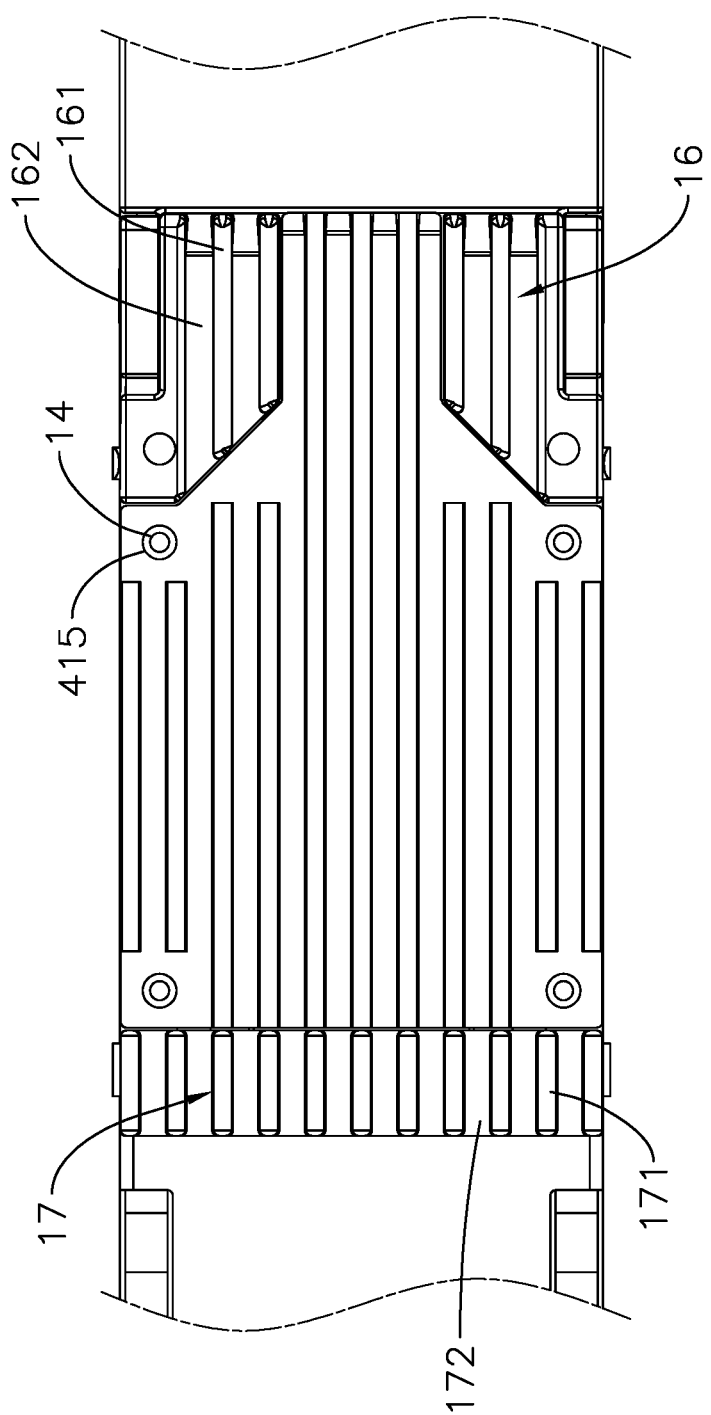
FIG. 5 is a top enlarged view of the connector in FIG. 1, showing the first heat sink and the case.

With further reference to FIGS. 2, 4, and 5, in this embodiment, the case 10 further has an outer surface 15, a second heat sink 16, and a third heat sink 17.

The outer surface 15 is opposite to the inner surface 13. The second heat sink 16 is formed on the outer surface 15 of the case 10, is adjacent to the first heat sink 40, and has multiple second cooling fins 161 and multiple second cooling wind passages 162. The second cooling fins 161 are parallel to the first cooling fins 42. The second cooling wind passages 162 are respectively formed between the second cooling fins 161. Each of the second cooling wind passages 162 is formed between two adjacent ones of the second cooling fins 161, and communicates with one of the first cooling wind passages 43. Preferably, the second cooling wind passages 162 each respectively communicate with the first cooling wind passages 43.

The third heat sink 17 is formed on the outer surface 15 of the case 10 and is adjacent to the first heat sink 40. The third heat sink 17 is located in front of the first heat sink 40 in the inserting direction D1, and the second heat sink 16 is located on a side opposite to the third heat sink 17. The third heat sink 17 has multiple third cooling fins 171 and multiple third cooling wind passages 172. The third cooling fins 171 are parallel to the first cooling fins 42. The third cooling wind passages 172 are respectively formed between the third cooling fins 171. Each of the third cooling wind passages 172 is formed between two adjacent ones of the third cooling fins 171 and communicates with one of the first cooling wind passages 172. Preferably, the third cooling wind passages 172 each respectively communicate with the first cooling wind passages 43.

The structure of the case 10 is not limited to the above-mentioned, as the case 10 can also be implemented without the second heat sink 16, without the third heat sink 17, or without both the second heat sink 16 and the third heat sink 17.

In addition, in this embodiment, the base board 41 of the first heat sink 40 further has a main segment 416, an extending segment 417, and a tapered segment 418. The main segment 416 is connected to the thermal diffusing unit 30, and the first cooling fins 42 are formed on the main segment 416. The extending segment 417 is connected to the main segment 416 and protrudes toward the inserting direction D1. A width of the extending segment 417 is smaller than a width of the main segment 416. At least one of the first cooling fins 42 extends to the extending segment 417, and the windward slopes 44 are formed on a front side of the extending segment 417. The second cooling fins 161 are respectively located on two sides of the extending segment 417 in the inserting direction D1. In the inserting direction D1, front ends of the second cooling fins are flush with a front end of the extending segment 417. The tapered segment 418 is connected between the main segment 416 and extending segment 417, and a width of the tapered segment 418 gradually decreases along the inserting direction D1. But in other embodiments, the base board 41 of the first heat sink 40 can also be implemented without the extending segment 417 and the tapered segment 418. In this case, the second heat sink 16 can be located in front of the first heat sink 40 in the inserting direction D1.

With the heat transfer coefficient of the material of the thermal diffusing unit 30 being larger than the case 10, the thermal diffusing unit 30 abutting both the inner surface 13 of the case 10 and the heating source 21 of the circuit board 20, and the area of the thermal diffusing unit 30 abutting the inner surface 13 being larger than the area of the thermal diffusing unit 30 abutting the heating source 21, the thermal diffusing unit 30 is allowed to transmit heat from a small area to a big area, thereby enlarging the heat conducting area of the heating source 21 and improving the heat dissipation efficiency.

In addition, with the first heat sink 40 abutting the thermal diffusing unit 30 and exposed from the case 10, and the heat transfer coefficient of the material of the first heat sink 40 larger than that of the case 10, the heat generated by the heating source 21 can be transmitted sequentially through the thermal diffusing unit 30 and the first heat sink 40 to the air outside the case 10, thereby further improving the heat dissipation efficiency.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A cable end connector, comprising:
   a case having
      an inner surface,
      an upper shell, and
      a lower shell secured with the upper shell;
   a circuit board mounted in the case and extending toward an inserting direction; at least a portion of the circuit board emerging from a front part of the case; the circuit board having
      a heating source;
   a thermal diffusing unit thermally coupled with the inner surface of the case and the heating source of the circuit board; a heat transfer coefficient of the thermal diffusing unit being larger than a heat transfer coefficient of the case, whole of the thermal diffusing unit being disposed within the case and being not exposed via the upper shell of the case; and
   a first heat sink thermally coupled with the thermal diffusing unit and connected with the case; a heat transfer coefficient of the first heat sink being larger than the heat transfer coefficient of the case; the first heat sink having
      a base board having
         a first surface thermally coupled with the thermal diffusing unit; and
         a second surface being opposite to the first surface;
      multiple first cooling fins formed on the second surface of the base board and extending toward a direction away from the base board; the first cooling fins spaced apart from each other and being parallel to each other; and
      multiple first cooling wind passages respectively formed between the first cooling fins; each of the first cooling wind passages formed between two adjacent ones of the first cooling fins.

2. The cable end connector as claimed in claim 1, wherein each of the first cooling wind passages is parallel to the inserting direction.

3. The cable end connector as claimed in claim 1, wherein the connector further has
   a heat sink cover mounted on the case and covering the first heat sink; the first cooling wind passages formed between the heat sink cover and the base board; and
   the first heat sink further has
      multiple windward slopes formed on a front side, which is in the front in the inserting direction, of the base board; the windward slopes respectively located between the first cooling fins; each of the windward slopes located between two adjacent ones of the first cooling fins, and facing toward the inserting direction.

4. The cable end connector as claimed in claim 2, wherein the connector further has
   a heat sink cover mounted on the case and covering the first heat sink; the first cooling wind passages formed between the heat sink cover and the base board; and
   the first heat sink further has
      multiple windward slopes formed on a front side, which is in the front in the inserting direction, of the base board; the windward slopes respectively located between the first cooling fins; each of the windward slopes located between two adjacent ones of the first cooling fins, and facing toward the inserting direction.

5. The cable end connector as claimed in claim 1, wherein the connector further has
a heat sink cover mounted on the case and covering the first heat sink;
an edge, which is away from the base board, of each of the first cooling fins abuts the heat sink cover.

6. The cable end connector as claimed in claim 4, wherein an edge, which is away from the base board, of each of the first cooling fins abuts the heat sink cover.

7. The cable end connector as claimed in claim 1, wherein the case further has
an outer surface being opposite to the inner surface; and
a second heat sink formed on the outer surface of the case, being adjacent to the first heat sink, and having
multiple second cooling fins being parallel to the first cooling fins; and
multiple second cooling wind passages respectively formed between the second cooling fins; each of the second cooling wind passages formed between two adjacent ones of the second cooling fins, and communicating with one of the first cooling wind passages.

8. The cable end connector as claimed in claim 6, wherein the case further has
an outer surface being opposite to the inner surface; and
a second heat sink formed on the outer surface of the case, being adjacent to the first heat sink, and having
multiple second cooling fins being parallel to the first cooling fins; and
multiple second cooling wind passages respectively formed between the second cooling fins; each of the second cooling wind passages formed between two adjacent ones of the second cooling fins, and communicating with one of the first cooling wind passages.

9. The cable end connector as claimed in claim 7, wherein the base board of the first heat sink further has
a main segment connected to the thermal diffusing unit; the first cooling fins formed on the main segment; and
an extending segment connected to the main segment and protruding toward the inserting direction; a width of the extending segment being smaller than a width of the main segment; at least one of the first cooling fins extending to the extending segment; and
the second cooling fins are respectively located on two sides of the extending segment in the inserting direction; in the inserting direction, front ends of the second cooling fins are flush with a front end of the extending segment.

10. The cable end connector as claimed in claim 8, wherein
the base board of the first heat sink further has
a main segment connected to the thermal diffusing unit; the first cooling fins formed on the main segment; and
an extending segment connected to the main segment and protruding toward the inserting direction; a width of the extending segment being smaller than a width of the main segment; at least one of the first cooling fins extending to the extending segment; and
the second cooling fins are respectively located on two sides of the extending segment in the inserting direction; in the inserting direction, front ends of the second cooling fins are flush with a front end of the extending segment.

11. The cable end connector as claimed in claim 9, wherein the base board of the first heat sink further has
a tapered segment connected between the main segment and the extending segment; a width of the tapered segment gradually decreasing along the inserting direction.

12. The cable end connector as claimed in claim 10, wherein the base board of the first heat sink further has
a tapered segment connected between the main segment and the extending segment; a width of the tapered segment gradually decreasing along the inserting direction.

13. The cable end connector as claimed in claim 1, wherein the case further has
an outer surface being opposite to the inner surface; and
a third heat sink formed on the outer surface of the case, being adjacent to the first heat sink, located in front of the first heat sink in the inserting direction, and having
multiple third cooling fins being parallel to the first cooling fins; and
multiple third cooling wind passages respectively formed between the third cooling fins; each of the third cooling wind passages formed between two adjacent ones of the third cooling fins, and communicating with one of the first cooling wind passages.

14. The cable end connector as claimed in claim 12, wherein the case further has
a third heat sink formed on the outer surface of the case, being adjacent to the first heat sink, located in front of the first heat sink in the inserting direction, and having
multiple third cooling fins being parallel to the first cooling fins; and
multiple third cooling wind passages respectively formed between the third cooling fins; each of the third cooling wind passages formed between two adjacent ones of the third cooling fins, and communicating with one of the first cooling wind passages.

15. The cable end connector as claimed in claim 1, wherein the base board of the first heat sink further has
an assembling surrounding wall formed on the first surface of the base board and surrounding an edge of the thermal diffusing unit.

16. The cable end connector as claimed in claim 14, wherein the base board of the first heat sink further has
an assembling surrounding wall formed on the first surface of the base board and surrounding an edge of the thermal diffusing unit.

17. The cable end connector as claimed in claim 1, wherein
the thermal diffusing unit further has
multiple assembling holes; and
the base board of the first heat sink further has
multiple assembling pins formed on the first surface of the base board and respectively mounted in the assembling holes of the thermal diffusing unit.

18. The cable end connector as claimed in claim 16, wherein
the thermal diffusing unit further has
multiple assembling holes; and
the base board of the first heat sink further has
multiple assembling pins formed on the first surface of the base board and respectively mounted in the assembling holes of the thermal diffusing unit.

19. A cable end connector comprising:
- a case having an upper shell and a lower shell, the upper shell secured with the lower shell and forming an accommodating space therebetween;
- a circuit board having a heating source secured thereon; the circuit board extending toward an inserting direction; at least a part of the circuit board being disposed in the accommodating space and at least a portion of the circuit board emerging from a front part of the case;
- a heat fin set thermally coupled with the case; the heat fin set having a plurality of cooling fins extending toward a direction away from the case; each of the plurality of cooling fins spaced apart from each other for forming multiple cooling wind passages therebetween; and
- a thermal diffusing unit thermally connecting the heating source and a bottom surface of the heat fin set; at least part of the thermal diffusing unit being thermally coupled to the case; a heat transfer coefficient of the thermal diffusing unit being larger than a heat transfer coefficient of the upper shell, wherein
- the heating source and the first heat fin set are thermally coupled via a first heat transmitting path and a second heat transmitting path simultaneously, the first heat transmitting path comprises nodes of the thermal diffusing unit and the upper shell, the second heat transmitting path comprises node of the thermal diffusing unit and does not comprise node of the upper shell.

20. The cable end connector as claimed in claim 19, wherein the cable end connector further comprises:
- a latch having at least two arms and a handle; the handle connected to rear ends of both of the two arms; the at least two arms respectively disposed at two lateral sides of the case;
- a thermal diffusing unit thermally connecting the heating source and a bottom surface of the heat fin set; and
- a heat fin cover mounted on the case and covering at least a portion of the heat fin set; the heat fin cover having a front opening and a rear opening with the heat fin set disposed therebetween.

* * * * *